United States Patent
Nilsson

(12) 
(10) Patent No.: US 6,389,266 B1
(45) Date of Patent: May 14, 2002

(54) DUAL BAND VCO

(75) Inventor: Magnus Nilsson, Lund (SE)

(73) Assignee: Telefonaktiebolaget LM Ericsson C Pub, Stockholm (SE)

( * ) Notice: Subject to any disclaimer, the term of this patent is extended or adjusted under 35 U.S.C. 154(b) by 0 days.

(21) Appl. No.: 09/656,114

(22) Filed: Sep. 6, 2000

(30) Foreign Application Priority Data

Sep. 13, 1999 (SE) .............................................. 9903257

(51) Int. Cl.[7] .................................................. H04Q 7/20
(52) U.S. Cl. ............................ 455/76; 455/86; 455/553
(58) Field of Search .............................. 455/86, 76, 88, 455/131, 314, 127, 84, 552, 553; 379/88.01; 327/105, 122, 156, 238; 331/117 R, 179; 375/200

(56) References Cited

U.S. PATENT DOCUMENTS

| | | | | |
|---|---|---|---|---|
| 5,303,417 A | * | 4/1994 | Laws | 455/314 |
| 5,564,076 A | | 10/1996 | Auvray | 455/76 |
| 5,740,521 A | | 4/1998 | Hulkko et al. | 455/76 |
| 5,983,081 A | * | 11/1999 | Lehtinen | 455/76 |
| 6,029,052 A | * | 2/2000 | Isberg et al. | 455/131 |
| 6,044,133 A | * | 3/2000 | Furukawa et al. | 379/88.01 |

FOREIGN PATENT DOCUMENTS

| | | |
|---|---|---|
| DE | 35 18 896 A1 | 11/1986 |
| EP | 0 496 498 A2 | 7/1992 |
| GB | 2 296 141 A | 6/1996 |

OTHER PUBLICATIONS

Gustavsson, B., International–Type Search Report, Search Request No. SE 99/01314, Jun. 13, 2000, pp. 1–4.

Abidi, A., "Radio–Frequency Integrated Circuits for Portable Communications," IEEE 1994 Custom Integrated Circuits Conference Proc., vol. Conf. 16, pp. 151–158.

* cited by examiner

*Primary Examiner*—Dwayne Bost
*Assistant Examiner*—Jean A Gelin

(57) ABSTRACT

A radio ASIC including a VCO (30) connected to both a homodyne receiver (60, 80, 90, 110, 120, 140, 150) for downconting the frequency of a received signal, when said radio ASIC is in a receiving mode (110, 120, A), and to a radio transmitter (70, 100, 110, 120) for transmitting another signal, when said radio ASIC is in a transmitting mode (110, 120, B). A divider (50) with a dividing factor of two is arranged between the VCO (30) and a mixer (80, 140) of the homodyne receiver in order to divide the signal from the VCO with a factor of two. The VCO is run on double GSM-RX-frequency implying that it covers both PCS-TX (radio ASIC in transmission mode) and GSM-RX (radio ASIC in receiving mode).

7 Claims, 2 Drawing Sheets

DUAL BAND VCO

FIELD OF INVENTION

The present invention relates to a radio circuit comprising a receiver, a transmitter and a VCO, preferably arranged in a mobile terminal.

BACKGROUND OF THE INVENTION

In a radio ASIC there is a need for a stable frequency to move information up and down in frequency. This stable frequency is normally generated by locking an unstable VCO to a very stable reference frequency, e.g. 13 MHz, using a PLL (Phase Locked Loop)-circuit. In FIG. 1 a PLL-circuit is disclosed containing a phase detector 150, a filter&lifier 160, a VCO and a divider with e.g. a dividing factor of 72. The PLL strives for maintaining the same signal frequencies at the inputs I, II of the phase detector. If for example the signal at input I of the phase detector has a reference frequency of 13 MHz (13 MHz-clock in the telephone) the other input II of the phase detector 150 strives for having the same frequency. This means that the VCO must run at a frequency of 72 multiplied by 13 MHZ equals 936 MHz, since the divider divides the signal from the VCO by a factor 72. Thus, the output signal III of the VCO is a very stable 936 MHz-signal, which could be used in the GSM-band.

As mobile terminals constantly decrease in size, more and more components have to be integrated on the same ASIC (Application Specific Integrated Circuit). The integration of the VCO on the ASIC will cover a major part of the ASIC area, and since the area cost is the main part of the total ASIC cost it is important to minimise it. It should be realised that up to now the inductor in the resonator circuit of the VCO has always been implemented outside the ASIC-circuit since it was not possible to make sufficiently good inductors on the chip. Thus, the invention deals with a new inventive area, i.e. how to implement the whole VCO including the inductor of the resonator inside the ASIC-circuit. However, the main object of the present invention is to decrease the number of VCO:s in order to occupy less space on the ASIC.

SUMMARY OF THE INVENTION

The above object is achieved by means of a radio circuit including a VCO connected to a radio receiver for down converting the frequency of a received signal, when the radio circuit is in a receiving mode, and to a radio transmitter for transmitting another signal when the radio circuit is in a transmitting mode.

Instead of using two different VCO:s, one for the receiver and another for the transmitter, we now use only one VCO for both the transmitter and the receiver, which of course implies that we save a lot of valuable ASIC area and costs.

In preferable embodiments of the invention, a divider with a dividing factor of two is arranged between the VCO and a mixer in the receiver for dividing the signal from the VCO with a factor two. The divider automatically generates the inphase signal and the quadrature signal eliminating the need of a phase shifter.

In a further preferable embodiment of the invention, the receiver is a homodyne receiver.

In another advantageous embodiment, the VCO is oscillating on double GSM-frequencies.

In an embodiment of the invention, the power of the divider is much smaller than the power of the VCO implying that only a small part of the 900 MHz signal is connected (i.e., inductively, capacitively) back to the receiver.

In another embodiment, the VCO used is run at 1850–1920 MHz.

The radio circuit is preferably a radio ASIC. This radio ASIC could of course be implemented in an arbitrary electrical machine, but it should be realized that the preferable electrical machine is a mobile terminal/telephone.

BRIEF DESCRIPTION OF THE DRAWINGS

The present invention will now be described in more detail with reference to preferred embodiments of the present invention, given only by way of examples, and illustrated in the accompanying drawings in which.

DETAILED DESCRIPTION OF EMBODIMENTS OF THE INVENTION

First of all it should be emphasised that this invention is related to pending applications titled "A VCO Switch" and "A Stacked VCO Resonator", applicant: Telefonaktiebolaget LM Ericsson, inventors: Magnus Nilsson, Thomas Mattson (A VCO Switch), Magnus Nilsson (A Stacked VCO Resonator). These applications, "A VCO Switch" and "A Stacked VCO Resonator", respectively are herewith to be incorporated in this application by reference.

Figure 1:
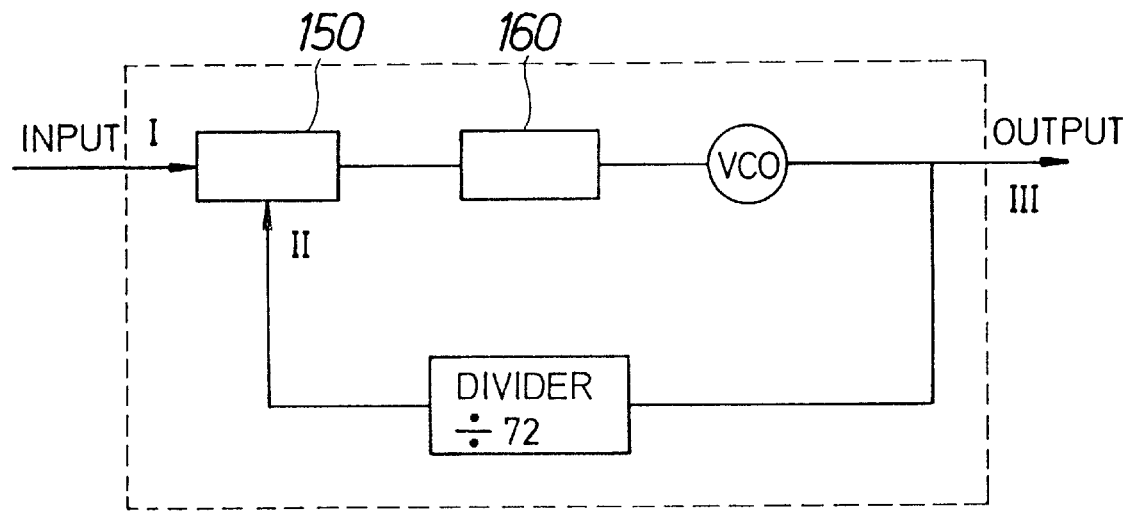
FIG. 1 illustrates the VCO-function in a PLL.
Figure 2:
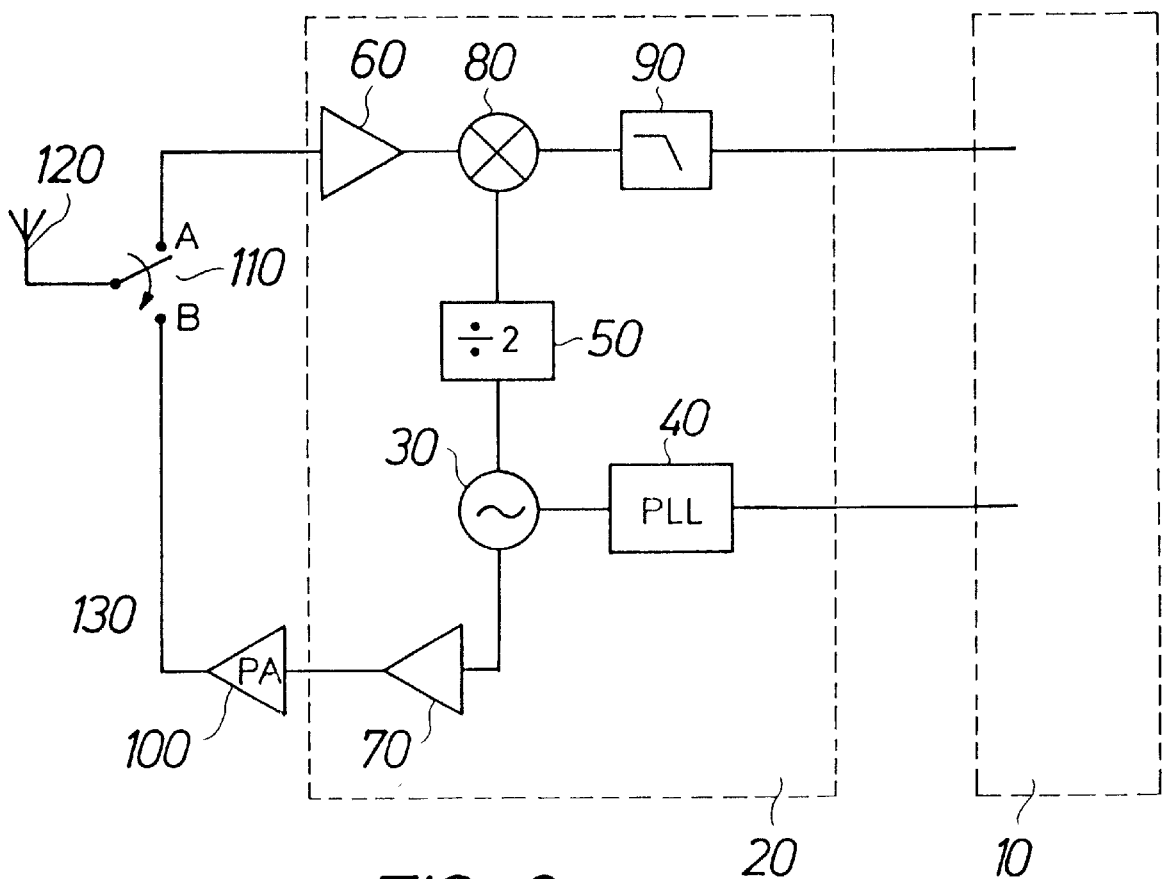
FIG. 2 is block diagram of the radio ASIC according to the present invention.
Figure 3:
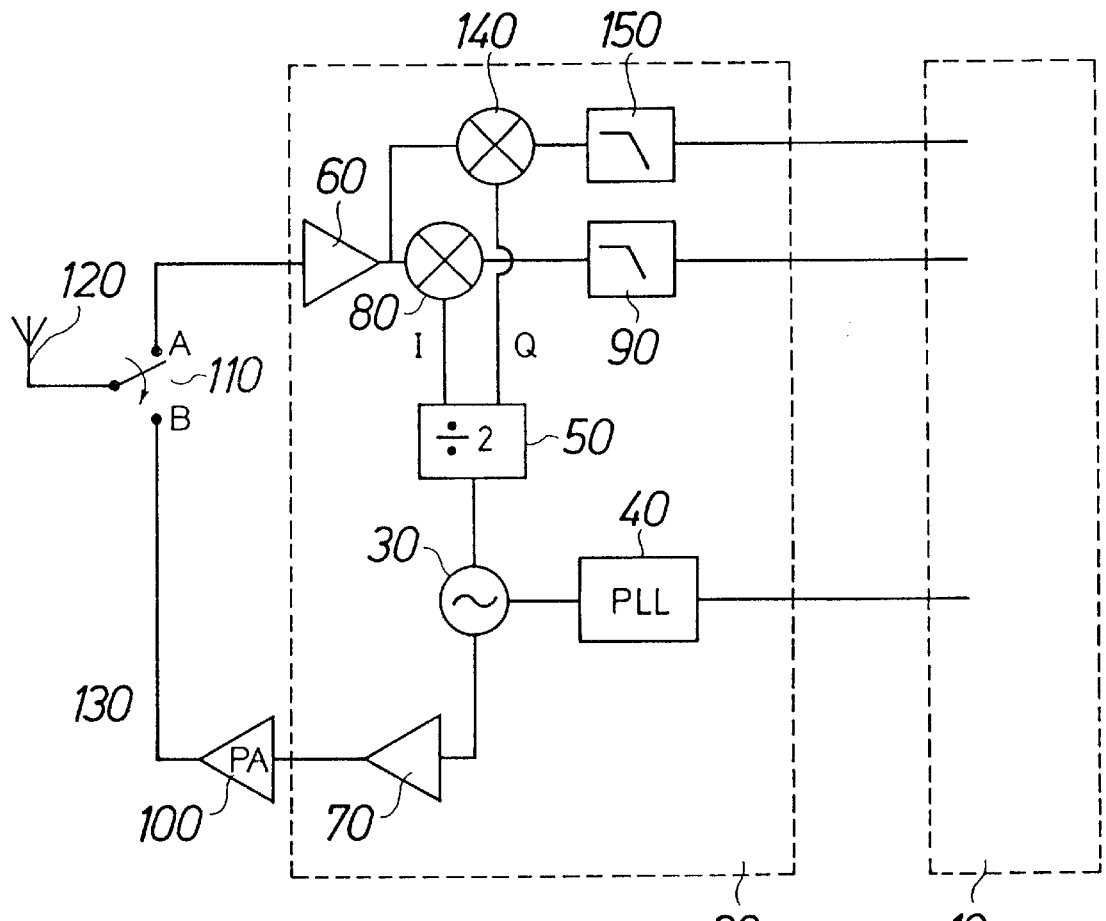
FIG. 3 is a block diagram according to FIG. 2 disclosing the I- and Q-signal, respectively.

FIG. 2 discloses a schematic view of the base band block 10 connected to the radio part 20, which in turn is connected the transmitter 130. The invention relates to the radio part, which in this case could be a radio ASIC 20. The base band part 10 is connected to the input of a PLL 40 (phase locked loop), the function of which is described above in relation to FIG. 1. The output of the PLL is coupled to the input of the VCO 30, which in turn is connected both to an input of the transmission means 70 and an input of the divider 50. The output of the divider is in turn connected to a mixer 80 in the receiving part of the radio ASIC. The output of the transmission means 70 is connected to the input of a power amplifier 100 (PA) in the transmitter 130, the output of which is connected to the antenna switch 110 and the antenna 120. The antenna 120 is connected to an input of the filter&lifier means 60 when the antenna switch 110 is in position A. When the antenna switch 110 is in position B the antenna 120 is connected to the output of the power amplifier 100. The output of the filter&lifier 60 means is connected to the mixer 80, which in turn is connected to the input of a filter 90, preferably a low pass filter. The output of the filter is connected to the base band block 10. The divider 50 divides the signal frequency from the VCO by a factor 2. It should of course be realised that another dividing factor could be used. The divider 50 generates an Inphase (I) signal and a Quadrature (Q) signal, which will be described in connection with FIG. 3. FIG. 2 discloses only one of the two signals (I, Q) for reasons of clarity. Since the receiving parts (demodulator) of the radio ASIC is a homodyne receiver (60, 80, 90, 50, 30) the signal frequency of the output of the divider 50 should have the same carrier frequency as the received signal at the antenna 120 in order to down convert the received radio signals to the base band. The received signal e.g. GSM-RX, antenna switch in position A, is in the frequency interval 925–960 MHz (extended GSM). In order to have the same frequency interval at the output of the divider 50 the VCO must have an oscillating frequency at the double frequency, i.e. 1850–1920 MHz. Thus, the VCO frequency is divided by a factor 2 in the divider 50 to obtain the GSM-signal frequency at the output of the divider 50. The two signals (GSM-spectrum and VCO-signal(LO-signal)) are mixed in the mixer 80, and the output of the mixer 80 contains both the difference and the sum of the two signals, wherein the sum is filtered away in the low pass filter 90. Therefore, the output of the low pass filter is a base band signal corresponding to the difference between the GSM-RX and the signal at the output of the divider 50. This base band signal is introduced in base band part 10 for demodulation. It should of course be realised that the above also applies for signals in the PCS-band or the DCS-band, and also when the signal is a data signal.

Thus, in the present invention the VCO is run on double GSM frequency i.e. 1850–1920 MHz. This implies that the resonator (inductor, coupling capacitor, and varactor) of the VCO can be smaller since a higher frequency implies smaller dimensions of the resonator.

In prior art (without the divider 50) the VCO is run on the GSM frequency (900 MHz), and because of the relatively high power of the VCO, a small part of the VCO signal is recoupled (i.e capacitively, inductively) to the input of the receiver (input of the amplifier&filter 60) interfering with the received radio signal. This interfered signal on 900 MHz will be down converted to the base band and affect the DC-level of the base band signal in a detrimental way. Thus, it will be difficult to detect the base band signal since the DC-level is to high. This problem is overcome by using the double GSM frequency (1800 MHz) according to the invention since the recoupled VCO signal will be filtered away in the base band low pass filter 90 and thus not affect the DC-level of the base band signal. However, a very small part of the VCO signal at 900 MHz is connected back from the divider 50 (dividing factor equals two). Since the power of the divider 50 is very small, at least 10 times smaller than the power of the VCO 30, the recoupled signal will also be small (proportional to the power of the divider) and affect the DC-level of the base band signal in a negligible way. Thus, in the present invention it is easy to extract/separate the base band signal from the DC-signal.

In a dual band radio ASIC, normally four VCO:s are used to be able to cover RX- and TX-frequencies in both bands. The present invention introduces three VCO:s covering same four frequency bands.

These VCO:s cover GSM-TX (880–915 MHz), GSM-RX (925–960 MHz), is PCS-TX (1850–1910 MHz) and PCS-RX (1930–1990 MHz). Other frequencies than the above mentioned could of course be covered by the VCO:s. As mentioned above the present invention resides in replacing two of these VCO:s with one VCO covering both GSM-RX and PCS-TX bands. If the VCO 30 in FIG. 2 is run on 1850–1920 MHz it covers both the PCS-TX-band and the GSM-RX-band (VCO-frequency divided by factor two). This implies that we only need to use three VCO:s in order to get the same result as we before got four VCO:s. Eliminating one VCO will of course reduce used ASIC-area. Since the components of the resonator become smaller when increasing the frequency it is favourable to run the VCO on double frequency. However, in the TX-VCO there is a noise floor requirement, which makes it difficult to run this VCO at double frequency. On the contrary the RX-VCO does not have this requirement, which implies that this VCO could be run on double frequency. If the VCO 30 in FIG. 2 is a RX-VCO for GSM run on double frequency it will cover 1850–1920 MHz, which means that it covers both PCS-TX and GSM-RX. It should also be emphasised that the noise requirements on these VCO:s are similar. Thus, the idea is to reuse the high band TX-VCO as a low band RX-VCO. The principle of the present invention has now been described mostly with reference to FIG. 2. In FIG. 2 only one signal (I or Q-signal) from the divider 50 has been described since the invention applies for both signals in the same way. However, in FIG. 3 it could be seen that the divider 50 generates the Inphase signal and the Quadrature signal (Q). The divider 50 automatically checks positive and negative phase transitions generating two signals with a phase difference of 90 degrees, i.e. I-signal and Q-signal. The I-signal is mixed in the mixer 80 as described in FIG. 2. The Q-signal is mixed in the mixer 140 in the same way as described in connection with FIG. 2. The I- and Q-signals are put together in the base band block 10 for demodulation.

It should be emphasised that the invention has been implemented in test circuits in our laboratory and the test results have been successful.

It would be appreciated by those of ordinary skill in the art that the present invention could be embodied in other specific forms without departing from the spirit or essential character thereof. The presently disclosed embodiments are therefore considered in all respects to be illustrative and not restrictive. The scope of the invention is indicated by the appended claims rather than the foregoing description, and all changes which come within the meaning and range of equivalence thereof are intended to be embraced therein.

What is claimed is:

1. A radio circuit comprising a receiver, a transmitter and a VCO, wherein said VCO is connected both to said receiver, for converting the frequency of a received signal, when said radio circuit is in a receiving mode, and to said transmitter for transmitting another signal, when said radio circuit is in a transmitting mode, said VCO oscillating on double GSM-frequencies controlling both transmitting bands on double GSM-frequencies and receiving bands on GSM-frequencies.

2. The radio circuit according to claim 1, wherein said radio circuit comprises a radio ASIC.

3. The radio circuit according to claim 1, wherein said GSM-frequencies are 925–960 MHz, and wherein said VCO is oscillating on 1850–1920 MHz.

4. The radio circuit according to claim 1, and further including a divider arranged between said VCO and a mixer in said receiver, said divider having a dividing factor of two for dividing the signal frequency of said VCO by two.

5. The radio circuit according to claim 4, wherein said divider generates an Inphase-signal and a Quadrature-signal by dividing the signal from the VCO.

6. The radio circuit according to claim 4, wherein said receiver is a homodyne receiver, and wherein the signal frequencies at an output of the divider coincide with the carrier frequency band in the receiver, and said signal frequencies and said frequency band are down converted to a baseband in said mixer.

7. The radio circuit according to claim 6, wherein said radio circuit is in a mobile terminal.

* * * * *

UNITED STATES PATENT AND TRADEMARK OFFICE
CERTIFICATE OF CORRECTION

PATENT NO.   : 6,389,266 B1
DATED        : May 14, 2002
INVENTOR(S)  : Magnus Nilsson Page 1 of 1

It is certified that error appears in the above-identified patent and that said Letters Patent is hereby corrected as shown below:

<u>Title page,</u>
Item [57], ABSTRACT,
Line 3, replace "downconting the frequency" with -- down converting the frequency --

<u>Column 3,</u>
Line 47, replace "*is PCS-TX (1850-1910MHz)*" with -- *PCS-TX (1850-1910MHz)* --

Signed and Sealed this

Fourth Day of February, 2003

JAMES E. ROGAN
*Director of the United States Patent and Trademark Office*